United States Patent

Blom et al.

[15] 3,678,404

[45] July 18, 1972

[54] LINEAR AMPLIFIER CIRCUIT

[72] Inventors: Dirk Blom; Adrianus Johannes Wilhelmus Marie Van Overbeek; Wilhelmus Antonius Joseph Marie Zwijsen, all of Emmasingel, Eindhoven, Netherlands

[73] Assignee: U.S. Philips Corporation, New York, N.Y.

[22] Filed: June 8, 1970

[21] Appl. No.: 44,133

[30] Foreign Application Priority Data

June 10, 1969 Netherlands..........................6908784

[52] U.S. Cl. ....................................330/22, 330/40, 330/69

[51] Int. Cl. ..........................................................H03j 3/04

[58] Field of Search............................330/18, 22, 30, 40, 69

[56] References Cited

UNITED STATES PATENTS 3,178,647 4/1965 Harnett..................................330/22

*Primary Examiner*—Roy Lake

*Assistant Examiner*—Lawrence J. Dahl

*Attorney*—Frank R. Trifari

[57] ABSTRACT

A linear amplifier circuit comprising two stages; each stage further comprising two transistors traversed in series by the same current. Cross coupling between the two stages avoid deviations from linearity of the amplifier due to differences in the base-emitter voltages of the transistors. The circuit is suitable for use in integrated circuits.

6 Claims, 6 Drawing Figures

Figure 1:
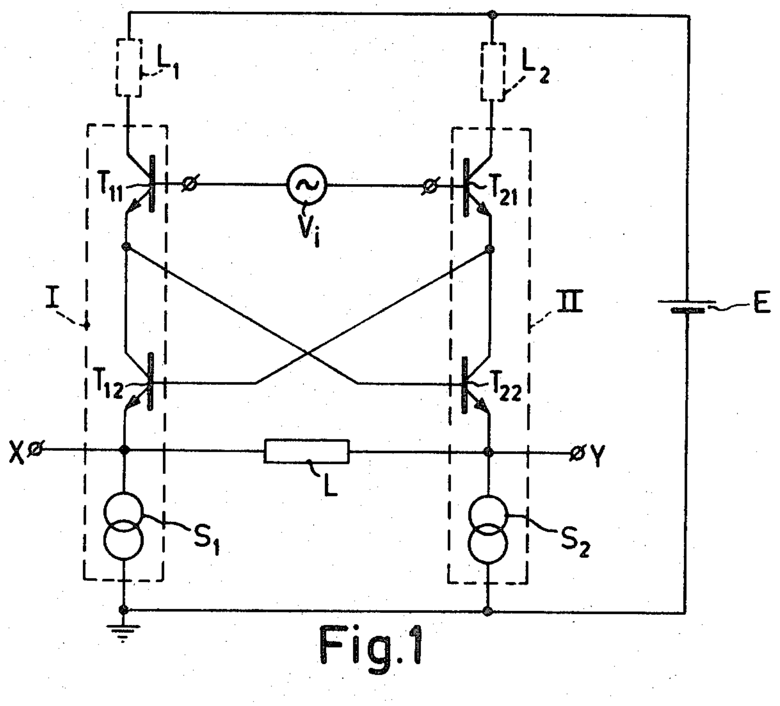

DIRK BLOM INVENTORS
ADRIANUS J.W.M. VAN OVERBEEK
WILHELMUS A.J.M. ZWIJSEN
BY
AGENT

INVENTORS
DIRK BLOM
ADRIANUS J.W.M. VAN OVERBEEK
WILHELMUS A.J.M. ZWIJSEN
BY
Frank R. Trifari
AGENT

INVENTORS
DIRK BLOM
ADRIANUS J.W.M. VAN OVERBEEK
WILHELMUS A.J.M. ZWIJSEN
BY

Frank R. Trifari

AGENT

LINEAR AMPLIFIER CIRCUIT

This invention relates to an amplifier circuit comprising two transistor stages which each comprise at least two junction transistors the emitter- collector paths of which are traversed in series by the same supply current, the arrangement being such that one terminal of the supply source is connected to the collector of the first of the transistors, the emitter of this transistor is connected to the collector of the second transistor and the emitter of the second transistor is connected through a current source to the other terminal of the supply source.

In amplifier circuits it frequently is the object to obtain voltage followers, voltage amplifiers or voltage current converters having transmission characteristics which are as linear as possible. In the known transistorized circuit arrangements, however, the base-emitter voltages of the transistors appear as disturbing functions in the transmission characteristics so that transmission is not free from distortion. Also, the base emitter voltage depends upon the direct-current bias of the transistor. Therefore, in circuit arrangements of the above-mentioned type attempts should be made to give the same direct-current bias to both stages, and this imposes exacting requirements on the current sources used. Finally, the base-emitter voltage of a transistor is highly temperature-dependent. This temperature dependence again shows itself in the transmission characteristic.

It is an object of the invention to provide a particular embodiment of the above-described circuit which is favorably distinguished from the known circuits specifically with respect to the linearity of the transmission characteristic.

The amplifier circuit according to the invention is characterized in that in known manner the base of the second transistor of one stage is connected to the emitter of the first transistor of the other stage.

It should be noted that a circuit is known which includes such a cross coupling using Zener diodes. In this circuit, the second transistors of both stages act as current sources having small quiescent currents which are switched by means of input signals through the Zener diodes. The two transistors of each stage are not traversed by the same quiescent current.

The invention is based on the recognition that the base-emitter voltage of a transistor is determined substantially solely by its emitter current. It is assumed that the two transistors in each stage have equal properties especially in respect to the differential emitter-base resistance with equal emitter current, which is readily obtainable with the present-day manufacturing techniques based on integrated circuits. It is further assumed that the current gain factors of the transistors are high so that the base currents are negligible relative to the emitter and collector currents. In this case the first and second transistors of one stage are traversed by the same direct current, which means that the base-emitter voltages of these transistors are equal. The steps according to the invention ensure that the base-emitter voltages of the first and second transistors of each stage show themselves in the transmission characteristic with opposite signs and hence cancel out. Thus, the influence of the base emitter voltages on the transmission characteristic is eliminated.

The circuit arrangement according to the invention has many possible uses. In a first use the input voltage is applied between the bases of the first transistors of the two stages of the circuit, an impedance, as the case may be an output impedance, being connected between the emitters of the second transistors of the two stages, which emitters may also act as output terminals. The voltage across the output terminals is equal to the input voltage without the occurrence of distortion so that a high-quality voltage follower providing a high current amplification is obtained.

The current flowing through the two stages of the circuit is proportional, with the exception of the constant bias direct current, to the voltages across the impedance connected between the emitters of the second transistors and hence to the input voltage. This provides a second possible use of the circuit according to the invention: The inclusion of an impedance in either or both collector circuits of the first transistors of both stages of the circuit provides the possibility of deriving from either or both collectors of the first transistors, either asymmetrically or symmetrically, a voltage which is proportional to the input voltage, again without the occurrence of distortion.

The amplification factor depends upon the impedance included between the emitters of the second transistors of the two stages. By using an impedance in the form of a variable resistance, for example a field-effect transistor (FET), the amplification factor of the circuit will be controllable.

The input impedance of the circuit is equal to the product of this impedance and the current amplification factor of the first transistors of both stages. Consequently, this input impedance is large relative to the impedance included between the emitters of the second transistors of the two stages.

This input impedance may additionally be increased by not including an impedance between the emitters of the second transistors of the two stages, but by connecting these electrodes to the input of a second similar amplifier circuit according to the invention and by terminating this circuit by such an impedance. Thus, the input impedance is increased by a factor equal to the current amplification factors of the first transistors of both stages of the second amplifier circuit. If the output voltage is taken from the collectors of the first transistors of the second amplifier circuit, obviously the amplification may, while retaining the same input impedance as in the case of a single amplifier circuit, be increased by the same factor by proportionately decreasing the impedance connected between the emitters of the second transistors.

Alternatively, the input may be increased by equipping the amplifier circuit according to the invention with more than two stages which each consist of the series combination of a current source and the emitter-collector paths of two transistors, the bases of the first and second transistors of one stage being connected to the emitters of the corresponding transistors of the preceding stage, and by increasing the direct current bias of each successive stage, starting from the two input stages, by a given factor.

In order to render the circuit according to the invention suitable for higher frequencies, two additional transistors may be included the emitter collector paths of which are connected in series with those of the first transistors of the two stages and the bases of which are set to a fixed potential. Thus, the reaction through the stray capacitances of the first transistors of the two stages on the input is greatly reduced.

In a further embodiment of the circuit arrangement according to the invention the bases of the first transistors of both stages are connected together, the signal source being connected between the emitters of the second transistors. The voltage set up between these emitters remains equal to the voltage between the bases of the first transistors and hence is zero. This means that the signal source is short-circuited. The current which is supplied by the signal source and which consequently is limited only by the internal impedance of this source, reappears in the collector circuits of the first transistors of the two stages.

Figure 2:
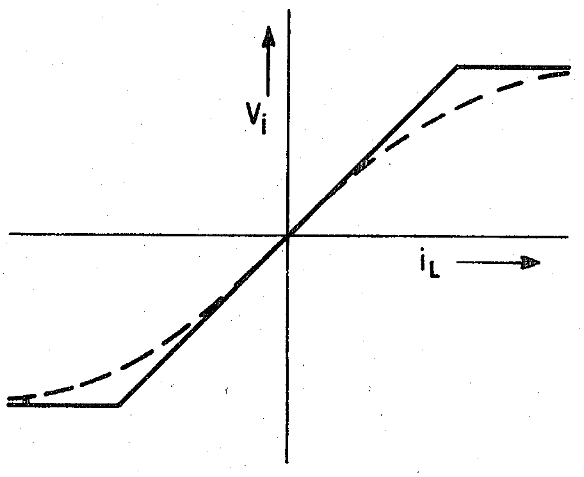
Figure 3:
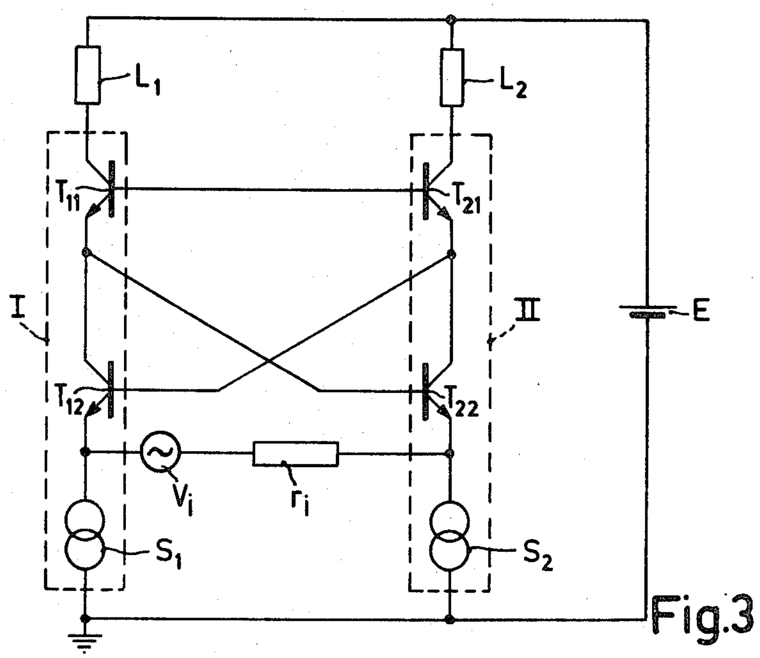
Figure 4:
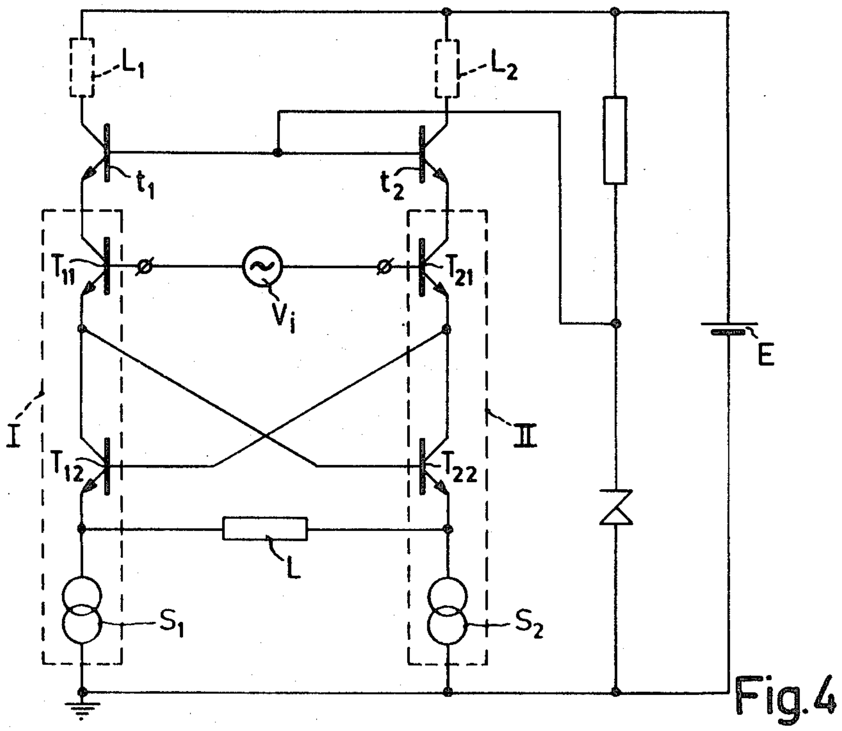
Figure 5:
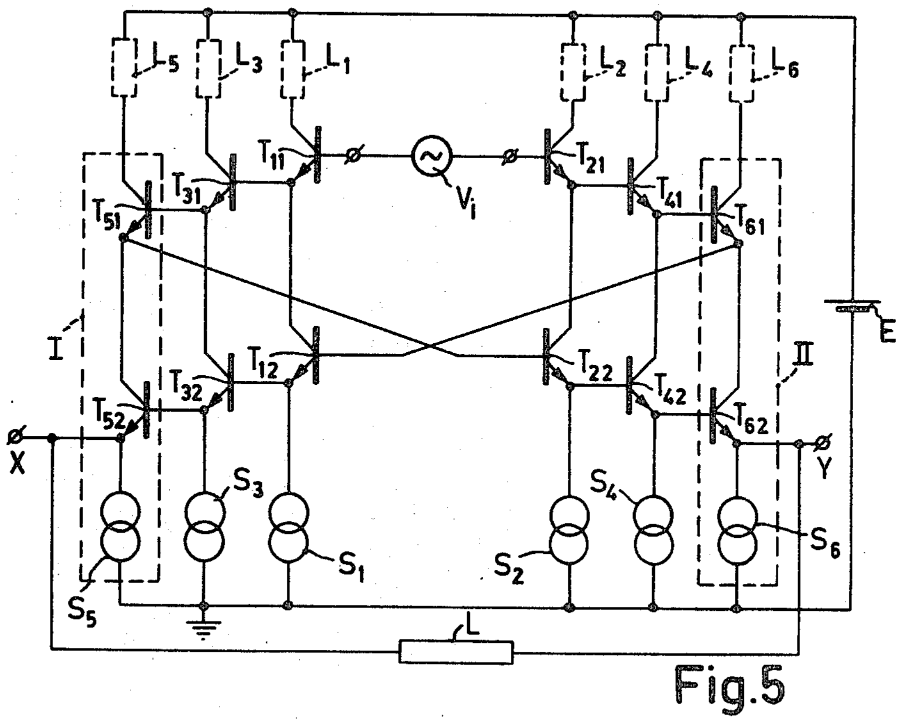
Figure 6:
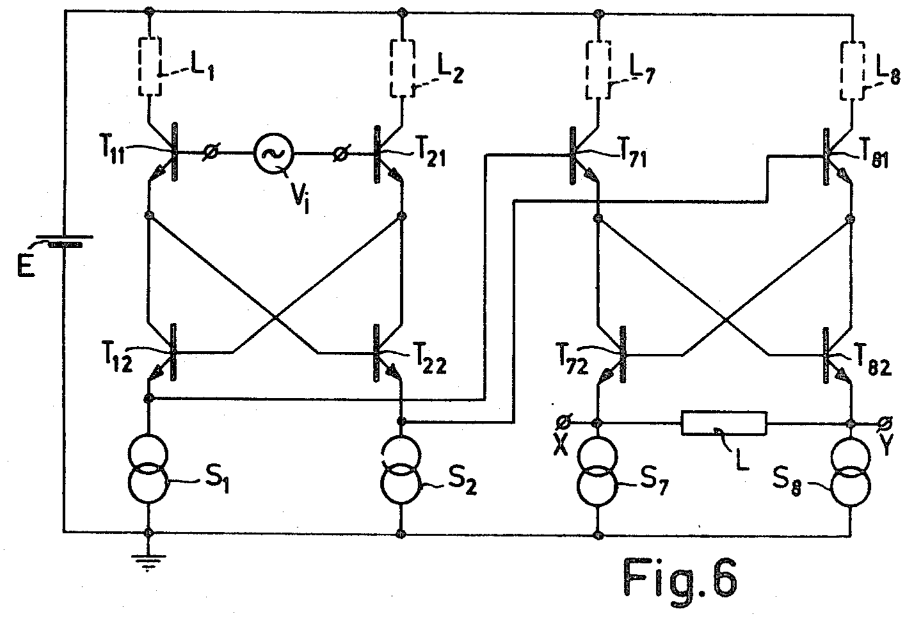

Embodiments of the invention will now be described, by way of example, with reference to the accompanying diagrammatic drawings, in which:

FIG. 1 shows a first embodiment of the circuit arrangement according to the invention, FIG. 2 shows the transmission characteristic of the circuit according to the invention in comparison with the characteristics of known circuits, FIG. 3 shows a second embodiment of the circuit arrangement according to the invention, FIG. 4 shows a first development of the circuit arrangement according to the invention, FIG. 5 shows a second development of the circuit arrangement according to the invention, and FIG. 6 shows a third development of the circuit arrangement according to the invention.

Referring now to FIG. 1, there is shown a circuit arrangement comprising two stages indicated by blocks I and II. The first stage includes transistors $T_{11}$ and $T_{12}$, the emitter of the first transistor $T_{11}$ of this stage being connected to the collector of the second transistor $T_{12}$ thereof. The second stage includes transistors $T_{21}$ and $T_{22}$, the emitter of the first transistor $T_{21}$ of this stage being connected to the collector of the second transistor $T_{22}$ thereof. The emitters of the transistors $T_{12}$ and $T_{22}$ are connected through current sources $S_1$ and $S_2$ respectively to a point of constant potential, i.e. one terminal of a voltage supply source E. According to the invention the base of the transistor $T_{12}$ is connected to the emitter of the transistor $T_{21}$, and the base of the transistor $T_{22}$ is connected to the emitter of the transistor $T_{11}$. The collectors of the transistors $T_{11}$ and $T_{21}$ are connected, if required through impedances $L_1$ and $L_2$ respectively, to a point of constant potential, i.e. the other terminal of the supply source E. The input voltage source is connected between the bases of the transistors $T_{11}$ and $T_{21}$, and an impedance L is connected between the emitters of the transistors $T_{12}$ and $T_{22}$.

If the current gain factors of the transistors are sufficiently high, the base currents will be negligible relative to the emitter and collector currents. As will be clear from the Figure, the emitter currents of the transistors $T_{11}$ and $T_{12}$ will then be equal, as will be emitter currents of the transistors $T_{21}$ and $T_{22}$. With equal properties of the transistors $T_{11}$ and $T_{12}$ this means that the base emitter voltages of these transistors are equal, and the same holds for the transistors $T_{21}$ and $T_{22}$.

Let the signal input voltage set up between the bases of the transistors $T_{11}$ and $T_{21}$ be $V_i$. The Figure clearly shows that the voltage at the emitter of the transistor $T_{12}$ is equal to the voltage at the base of the transistor $T_{21}$ less the base-emitter voltages of the transistors $T_{21}$ and $T_{12}$, and that the voltage at the emitter of the transistor $T_{22}$ is equal to the voltage at the base of the transistor $T_{11}$ less the base-emitter voltages of the transistors $T_{11}$ and $T_{22}$. Owing to the equality of the corresponding base-emitter voltages the voltage $V_{xy}$ between the emitters of the transistors $T_{12}$ and $T_{22}$ then will be equal to the input voltage $V_i$, the values of the base-emitter voltages being insignificant, since the corresponding base-emitter voltages cancel with respect to the output voltage.

This does not mean that the two stages (I and II) of the circuit arrangement must have the same direct-current bias. In the case of a bias difference, the base-emitter voltages of the transistors of the stage I will differ from those of the transistors of the stage II. However, the voltage at terminals $x$ and $y$ is determined by the input voltage and by the sum of the base-emitter voltages of one transistor of stage I and of one transistor of stage II. Thus the influence of different direct-current biasses on the output voltage will also be eliminated. The current flowing through an impedance L is equal to the input voltage $V_i$ divided by the impedance L. This current appears in the collector circuits of $T_{11}$ and $T_{21}$. The inclusion of an impedance in either or both circuits provides the possibility of choosing the collector of either or both first transistors of the two stages as the output terminal or terminals, permitting the output voltage to be derived both asymmetrically and symmetrically. Thus, the linear voltage amplification is obtainable. One of the factors which determine the amplification factor is the value of the impedance L. Using a variable impedance, for example the channel of a FET, permits of controlling the amplification of the circuit arrangement. The FET preferably will be an isolated-gate field effect transistor to which the amplification control voltage is applied. Obviously, a selective amplifier is obtainable by using an impedance L in the form of a resonant circuit.

It may further be readily seen from the Figure that the input impedance of the circuit arrangement is equal to the product of the current amplification factor of the first transistors of both stages and the impedance L. Since this current amplification factor is assumed to be high and in present-day transistors remains constant over a large current range, the use of a fixed-value impedance L results in that the input impedance is constant and high relative to this impedance L.

In FIG. 2 the full line represents the transmission characteristic of the circuit arrangement according to the invention. The current $i_L$ through the impedance L is plotted along the horizontal axis and the input voltage $V_i$ is plotted along the vertical axis. Up to the instant at which the collectors of the transistors $T_{12}$ and $T_{22}$ are overdriven the characteristic is truly linear. The broken line represents the characteristic of known circuit arrangements in which owing to the non-linear relationship between the emitter current and the base-emitter voltage of each transistor distortion occurs.

FIG. 3 shows a second embodiment of the circuit arrangement according to the invention, in which the bases of the transistors $T_{11}$ and $T_{12}$ are connected to one another, a signal voltage source $V_i$ having an internal resistance $r_i$ being connected between the emitters of the transistors $T_{12}$ and $T_{22}$. The current introduced by the voltage source $V_i$ reappears in the collector circuits of the transistors $T_{11}$ and $T_{12}$, i.e. at the points from which the output voltage can again be derived. The voltage across the voltage source $V_i$ and across the internal resistance $r_i$ is equal to the voltage between the bases of the transistors $T_{11}$ and $T_{21}$ and hence is equal to zero. Thus the voltage source $V_i$ is effectively short-circuited and the current delivered is limited only by the internal resistance $r_i$ of the voltage source $V_i$. Therefore, a small signal voltage will produce large currents in the collector circuits of the transistors $T_{11}$ and $T_{21}$ if the internal impedance of the voltage source is small.

FIG. 4 shows a development of the circuit arrangement of FIG. 1, in which the emitter-collector paths of two additional transistors $t_1$ and $t_2$ have been connected in series with those of the transistors $T_{11}$ and $T_{21}$. The bases of the additional transistors are at a fixed potential. As a result, the reaction on the input through the stray capacitances between the collector and base of each first transistor $T_{11}$ and $T_{21}$ is drastically reduced, so that operation of the circuit arrangement is satisfactory up to comparatively high frequencies.

FIG. 5 shows a development of the circuit arrangement according to the invention comprising two groups of transistors which each consist of more than one stage. Each stage comprises a series combination of a current source $S_1$ to $S_6$ respectively and of the emitter - collector path of two transistors $T_{11}$ $-T_{12}$ to $T_{61} - T_{62}$ respectively. The bases of the first and second transistors of a stage of a group are connected each to the emitter of the first and second transistor respectively of the preceding stage of the same group, so that a cascade of emitter followers is formed. The input voltage source $V_i$ is connected between the bases of the first transistors $T_{11}$ and $T_{21}$ of the first stages of the two groups, and the impedance L is connected between the emitters of the second transistors $T_{52}$ and $T_{62}$ of the last stages of the two groups. The cross-coupling is provided between the base of the second transistor ($T_{12}$ and $T_{22}$ respectively) of the input stage of one group and the emitter of the first transistor ($T_{62}$ and $T_{51}$ respectively) of the output stage of the other group. The operation of the circuit arrangement is identical with that of the circuit arrangement of FIG. 1. However, the input impedance may be considerably increased by a suitable choice of the various current source S. The direct-current bias of each successive stage of one group, starting from the input stage $T_{11}$ and $T_{21}$ respectively, can be increased by a given factor, that is to say the d.c. bias of the transistors $T_{31}$, $T_{32}$, $T_{41}$ and $T_{42}$ can be many tens of times greater than that of the transistors $T_{11}$, $T_{12}$, $T_{21}$ and $T_{22}$, whilst that of the transistors $T_{51}$, $T_{52}$, $T_{61}$ and $T_{62}$ in turn is many tens of times greater than that of the transistors $T_{31}$, $T_{32}$, $T_{41}$ and $T_{42}$. Thus, with a very small input current a large output current is obtainable. The only requirement to be satisfied is that the base currents of the transistors of one stage must be small relative to the emitter currents of the transistors of the preceding stage of the same group. This requirement can readily be satisfied by using transistors having high current amplification factors.

FIG. 6 shows a development of the circuit arrangement according to the invention, in which no impedance L has been connected between the emitters of the second transistors $T_{12}$ and $T_{22}$ but these emitters are each connected to the base of the third transistor $T_{71}$ and $T_{81}$ respectively of a second similar circuit arrangement. The impedance L has been included between the emitters of the second transistors $T_{72}$ and $T_{82}$ of this second circuit. The input voltage $V_i$ is again applied between the bases of the transistors $T_{11}$ and $T_{21}$ of the first circuit. The input impedance now will be equal to the product of the current amplification factor of the transistor $T_{11}$ (or $T_{21}$), the current amplification factor of the transistor $T_{71}$ (or $T_{81}$) and the impedance L. Compared with the circuit arrangement shown in FIG. 1, this impedance has been increased by a factor equal to the current amplification factor of the transistor $T_{71}$ or $T_{81}$ respectively.

Also, while retaining the same input impedance as in the circuit arrangement shown in FIG. 1, the impedance L may be reduced by the same factor, so that using the voltages across the collector impedances $L_7$ and $L_8$ of the transistors $T_{71}$ and $T_{81}$ respectively of the second circuit, the amplification factor is increased by the same factor.

By connecting further circuit arrangements according to the invention in series, both the input impedance and the amplification factor can be increased.

In this case, it is of advantage to use transistors of opposite conductivity types for successive circuits so that the required supply voltage can be maintained low.

What is claimed is:

1. A linear amplifier circuit comprising two transistor series circuit arrangements, each of said transistor arrangements comprising first and second junction transistors having their emitter-collector paths traversed by the same current, input voltage sources connected to the base of the first transistors of each arrangement, a voltage source connected in parallel with said transistor arrangements, the first transistors of each arrangement having their collectors connected to one terminal of said voltage source and their emitters connected to the collectors of the second transistors in their respective arrangements and the bases of the second transistors in the other arrangements, current sources, the emitters of the second transistors in each arrangement being connected through said current sources to the other terminal of said voltage source thereby providing undistorted signals proportional to said input voltage sources, and an impedance between the emitters of the second transistors of each arrangement for determining the current amplification of said circuit.

2. A linear amplifier circuit as claimed in claim 1 wherein said impedance is a variable resistor.

3. A linear amplifier circuit as claimed in claim 1 further comprising transistors in the collector circuits of the first transistors in each arrangement, said collector circuit transistors having bases operating at a fixed potential.

4. A linear amplifier circuit comprising two transistor series circuit arrangements, each of said transistor arrangements comprising first and second junction transistors having their emitter-collector paths traversed by the same current, the bases of the first transistors of each arrangement are connected together, input voltage sources connected between the emitters of the second transistors of each arrangement thereby providing undistorted signals limited by the impedance of said input voltage sources, a voltage source connected in parallel with said transistor arrangements, the first transistors of each arrangement having their collectors connected to one terminal of said voltage source and their emitters connected to the collectors of the second transistors in their respective arrangements and the bases of the second transistors in the other arrangements, and current sources, the emitters of the second transistors in each arrangement being connected through said current sources to the other terminal of said voltage source.

5. A linear amplifier circuit as claimed in claim 1 wherein each of said transistor arrangements comprises a plurality of first and second transistor stages in cascade, the bases of the first and second transistors of successive stages being connected to the emitters of the first and second transistors of the preceding stage of the same arrangements, respectively, the emitters of the first transistor of the last stage of each arrangement being connected to the bases of the second transistors in the first stage of the other arrangement.

6. A linear amplifier circuit as claimed in claim 1 wherein the emitters of the second transistors in each arrangement is connected to the bases of the first transistors of corresponding arrangements of a second linear amplifier circuit.

* * * * *